(12) United States Patent
Shenoy

(10) Patent No.: US 6,310,386 B1
(45) Date of Patent: Oct. 30, 2001

(54) HIGH PERFORMANCE CHIP/PACKAGE INDUCTOR INTEGRATION

(75) Inventor: Jayarama N. Shenoy, Santa Clara, CA (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 09/215,019

(22) Filed: Dec. 17, 1998

(51) Int. Cl.[7] .................................................. H01L 29/00

(52) U.S. Cl. .......................... 257/531; 257/724; 257/778

(58) Field of Search .................................... 257/531, 277, 257/728, 778, 723, 724, 692, 786; 336/200, 232; 343/895, 741; 438/381

(56) References Cited

U.S. PATENT DOCUMENTS

| | | | |
|---|---|---|---|
| 3,757,175 | * 9/1973 | Kim et al. | 336/200 |
| 4,494,100 | * 1/1985 | Stengel et al. | 336/200 |
| 5,416,356 | * 5/1995 | Staudinger et al. | 257/531 |
| 5,481,131 | * 1/1996 | Staudinger et al. | 257/531 |
| 5,530,288 | * 6/1996 | Stone | 257/780 |
| 5,598,032 | * 1/1997 | Fidalgo | 257/728 |
| 5,710,458 | * 1/1998 | Iwasaki | 257/778 |
| 5,747,870 | * 5/1998 | Pedder | 257/531 |
| 5,936,299 | * 8/1999 | Burghartz | 257/531 |
| 5,939,783 | * 8/1999 | Laine et al. | 257/778 |
| 6,005,466 | * 12/1999 | Pedder | 336/200 |
| 6,218,729 | * 4/2001 | Zavrel, Jr. et al. | 257/698 |

FOREIGN PATENT DOCUMENTS

| | | |
|---|---|---|
| 694932 | * 1/1996 | (EP) . |
| 63116410 | * 5/1988 | (JP) . |
| 12-18251 | * 6/2000 | (JP) . |

OTHER PUBLICATIONS

J. Lin, "Chip–Package Codesign for High–Frequency Circuits and Systems", pp. 24–31, 1998 IEEE, Bell Laboratories, Lucent Technologies.

Yue, Ryu, Lau, Lee and Wong, "A Physical Model for Planar Spiral Inductors on Silicon", pp. 155–158, 1996 IEEE, Stanford University, Dept. of Elec. Eng., Stanford, CA.

(List continued on next page.)

Primary Examiner—Olik Chaudhuri
Assistant Examiner—Alonzo Chambliss
(74) Attorney, Agent, or Firm—Martine & Penilla, LLP

(57) ABSTRACT

A packaged semiconductor circuit for use in processing digital and RF signals. The packaged semiconductor circuit includes a package structure having a first side that includes a metallization layer. The metallization layer has a first part at about a center of the first side and a second part that surrounds the center. The circuit further includes a semiconductor die that is attached to the package structure at about the first part of the metallization layer. The semiconductor die has an interconnection side including an array of bumps that are configured to make electrical connection to selected ones of a first plurality of metallization traces that are defined in the first part of the metallization layer of the package structure. The circuit also includes a spiral inductor trace that is formed from the metallization layer of the package structure and is defined in the first part of the metallization layer. And, selected ones of the array of bumps are electrically interconnected to a first end of the spiral inductor trace and to a second end of the spiral inductor trace, such that selected ones of the array of bumps electrically interconnect the spiral inductor trace of the package structure to the semiconductor die and to selected ones of the first plurality of metallization traces. Furthermore, spiral inductor that is part of the package structure has a significantly improved quality factor "Q" and self-resonant frequency compared to a die fabricated inductor.

20 Claims, 10 Drawing Sheets

OTHER PUBLICATIONS

Chang, Abidi and Gaitan, "Large Suspended Inductors on Silicon and Their Use in a 2–µm CMOS RF Amplifier", pp. 246–248, IEEE Electron Device Letters, vol. 14, May 5, 1993.

Park, Kim, Park, Yu and Nam, "High Q Microwave Inductors in CMOS Double–Metal Technology and Its Substrate Bias Effects for 2 GHz RF Ics Application", pp. 59–62, 1997 IEEE, Electronics and Telecommunications Research Inst., Korea.

Park, Lee, Yu and Nam, "Optimization of High Q CMOS–Compatible Microwave Inductors Using Silicon CMOS Technology", pp. 181–184, 1997 IEEE, Electronics and Telecommunications Research Inst., Korea.

Hürrich, Hübler, Eggert, Kück, Barthel, Büdde, and Raab, "SO1–CMOS Technology with Monolithically Integrated Active and Passive RF Devices on High Resistivity SIMOX Substrates", 10–96 IEEE Internat'l SOI Conf., Dresden, Germany.

* cited by examiner

HIGH PERFORMANCE CHIP/PACKAGE INDUCTOR INTEGRATION

BACKGROUND OF THE INVENTION

1. Field of the Invention

The present invention relates generally to integrated circuits and package integration and, more particularly, to the integration of radio frequency inductors in cost effective package technologies that enable efficient and high performance integrated circuit chip to package communication.

2. Description of the Related Art

Commensurate with the need for higher performing integrated circuits, there is also a need for low cost solutions due to a high demand for affordable consumer electronics. This demand is particularly evident in the cellular telephone market, where consumers are demanding more functionality, versatility, useful life, etc., while at the same time expecting cellular telephone costs to keep decreasing.

As is well known, electronics like cellular telephones utilize a combination of radio frequency (RF) circuits and digital electronics. As circuit developers push for "system-on-a-chip" solutions, the RF circuitry is now being integrated into the same chip or a set of chips in order to present the consumer with a compact, light weight, and powerful electronic device. Unlike conventional digital and mixed signal integrated circuits, RF circuits need inductors in addition to transistors, resistors and capacitors. Implementing the transistors, resistors, and capacitors in a conventional integrated circuit chip is generally straight forward and efficient. However, implementing inductors on the integrated circuit chip presents a challenging proposition.

As is well known to those skilled in the art of RF circuitry, designing inductors on a chip will require a substantial amount of chip area. For ease of description, reference is now drawn to FIG. 1A, where a across-sectional view 10 of a semiconductor substrate 12 of a chip is shown. In general, when an inductor is fabricated on a chip, other conventional transistor devices 14 will not be allowed to be designed in the substrate 12 over an on-chip inductor reserved area 16 (i.e., where only inductors will be fabricated). Typically, a single on-chip inductor will consume an area of about 400 microns by 400 microns. Although the design of a single inductor on the chip may not pose a large threat to the available chip area, most modest RF circuits generally require anywhere between 4 inductors to 16 inductors, and other more sophisticated RF circuits can require substantially more than 16 inductors. It should thus be appreciated that on-chip inductors used in RF circuits places a very large demand o n chip area, which necessarily translates into larger silicon chips and greater IC chip cost.

FIG. 1B illustrates a simplified example of system circuitry 20 for use in cellular phone applications. In this example, the system circuitry 20 has antennas 22a and 22b, in which 22a can be used for receiving and 22b can be used for transmitting. Of course, a single antenna can also be used for both the receiving and transmitting tasks. From the receiving antenna 22a, the received signal is passed through a filter/impedance matching circuit 24a, a low noise amplifier (LNA) 26, and another filter/impedance matching circuit 24b. The signal is then pass ed to a down-converter 28a that is well suited to convert the received RF signal into a digitized signal. The digitized signal is then passed to a digital CMOS base band processor 30. For transmitting, the digital CMOS base band processor 30 passes a digital signal to an up-converter 28b. The up-converter 28b will then process the digital signal into a suitable RF signal that is communicated to a power amplifier 34. A frequency synthesizer 32 is shown connected to the down-converter 28a and up-converter 28b. Once the signal is amplified, the signal is transmitted out of the transmitting antenna 22b, or alternatively via the same antenna 22a.

As will be apparent to one of skill in the art, upon analyzing the functionality of the system circuitry 20, up to about 16 inductors may be needed to implement the necessary RF signal processing. As a result, because inductors will continue to be needed in RF circuit applications, the size of the RF circuitry chips will unfortunately continue to take up a lot of chip area.

FIG. 1C illustrates a cross-sectional view of the substrate 12, having a patterned metallization line 40 over a dielectric layer 41. FIG. 1F shows a circuit representation of an inductor that is fabricated on a chip. In general, the inductor Lchip will have a parasitic series resistance Rchip, and a parasitic capacitance Cchip that is identified as C1 in FIG. 1C. The parasitic series resistance Rchip is identified as R1, which corresponds to the series resistance along the patterned metallization line 40. Because the resistance R1 can be substantial in certain cases, designers typically attempt to replicate the patterned metallization line 40 over various dielectric layers. This is illustrated in FIG. 1D, where two stacked patterned metallization lines 40a and 40b respectively formed over dielectric layers 41a and 41b are interconnected using conductive vias 42. Although the parallel resistance of both lines 40a and 40b, which are illustrated as R2, may be approximately half of R1, in actuality the total resistance including R3 (R3 resistance of the conductive vias) may be only slightly less than R1 as shown in FIG. 1E. As such, multiple stacking of metal lines may not be as effective in reducing the series resistance as expected. Although the parallel resistance of both lines 40a and 40b, which are illustrated as R2, may be thought to be approximately half of R1, in actuality by including the resistance of the conductive vias (i.e., R3), the total resistance significantly increases. As such, multiple stacking of metal lines may not be as effective in reducing the series resistance as expected. As a further drawback, when this stacking of metal lines is performed in an attempt to reduce the parasitic series resistance, the parasitic capacitance C2 will actually increase because the patterned metallization line 40b will be closer to the substrate 12.

In prior art attempts to reduce the parasitic capacitance of the inductor structure, designers have etched the substrate to increase the separation between the lowest patterned metallization line and the substrate. However, etching the substrate for this purpose departs from standard semiconductor processing, and therefore, the circuit may not have long term reliability. For more discussion on substrate etching, reference may be made to a paper entitled "Large Suspended Inductors on Silicon and Their Use in a 2-m COMS RF Amplifier," by J.Y.-C. Chang, et al., IEEE Electron Device Letters, Vol. 14, No. 5, May 1993. This paper is incorporated by reference herein.

Reference is now drawn to FIG. 1G, wherein a plot of reactance vs. frequency is provided to illustrate the off-setting affect a high parasitic capacitance can have on inductance. As shown, the reactance is initially positive at lower frequencies, however, as frequency increases, capacitive coupling begins to increase thereby dragging the inductance down. At a certain frequency, referred to as "a self-resonant frequency," the positive reactance of the inductor will cross the horizontal line and produce a negative reactance. The negative reactance is, in this example, a result of the increasing parasitic capacitance as frequency increases.

It should now be evident that the on-chip inductor of FIG. 1F, will not have an inductive response over the entire operating frequency. As a result, the inductor will be limited in operation to a desired inductive operating frequency range, which extends just around or after the fall toward the self-resonant frequency.

Accordingly, one manner by which an inductor's performance is measured is by examining what the self-resonant frequency. The greater the self-resonant frequency is, the inductor will have a greater frequency range of operation. Another manner by which an inductor's performance is measured is by its quality factor "Q." Quality factor "Q" represents how much useful energy is stored in the inductor vs. how much energy is lost in the parasitic components (e.g., Rchip and Cchip of FIG. 1F). In on-chip inductors, the quality factor is generally known and documented to be quite low, ranging between about 2 and 8. For a better understanding of the poor quality factors obtained for on-chip inductors, reference may be made to a paper entitled "A Physical Model For Planar Spiral Inductors On Silicon," by C. Patrick Yue, et al., IEEE IEDM 96, 155–158 (6.5.1–6.5.4), 1996. This paper is hereby incorporated by reference. As shown in FIGS. 6–8 of C. Patrick Yue, et al., the quality factor Q at about 1GHz only ranges between 4 and 6.5.

Optimally, it is generally desired to have as high of a quality factor Q as possible, ranging between about 50 and 100. However, due to the high parasitic capacitance and series resistance of on-chip inductors, the quality factor will rarely reach a high desirable number. In summary, on-chip inductors generally have a poor quality factor and also have an operation limiting self-resonant frequency.

In view of the foregoing, what is needed is a technique for making inductors for use in integrated circuit systems which have superior quality factors and substantially increased self-resonant frequencies, all being obtained at a zero added fabrication cost. There is also a need for high performance inductor structures for use in RF systems, which reduce chip area consumption, have superior quality factors, and increased self-resonant frequencies.

SUMMARY OF THE INVENTION

Broadly speaking, the present invention fills these needs by providing a digital and RF circuit combination that is configured to be integrated in a chip and package arrangement. In general, the chip and package arrangement is designed to have RF inductors fabricated directly on the package in a location that is well suited to directly interface with the chip being packaged to achieve improved RF circuit performance, chip area reductions, and zero added development costs. It should be appreciated that the present invention can be implemented in numerous ways, including as a process, an apparatus, a system, a device, a computer readable medium or a method. Several inventive embodiments of the present invention are described below.

In one embodiment, a digital and radio frequency (RF) circuit is disclosed. The circuit includes a package structure having a first side that has a metallization layer. The metallization layer is divided into a first part and a second part. A semiconductor die is attached to the package structure. The semiconductor die has an interconnection side that includes an array of bumps that are configured to make electrical connection to selected ones of a first plurality of metallization traces that are defined in the first part of the metallization layer of the package structure. The circuit further includes a spiral inductor trace defined in the first part of the metallization layer of the package structure, and selected ones of the array of bumps electrically interconnect the spiral inductor trace to the semiconductor die. The spiral inductor trace having a significantly improved quality factor "Q" and an increased self-resonant frequency relative to on-chip inductors.

In another embodiment, a method of making a circuit having RF components and digital components is disclosed. The method includes: (a) identifying the RF components in the circuit; (b) identifying inductors in the RF components; (c) pattering spiral inductors in a metallization layer of a semiconductor package, such that the spiral inductors are fabricated in a first region that is designed to receive a semiconductor chip; (d) fabricating the semiconductor chip to complete the circuit having the RF components and digital components, such that the semiconductor chip does not have inductor components; and (e) coupling the semiconductor chip to the metallization layer of the semiconductor package, such that the semiconductor chip communicates with the spiral inductors that are patterned on the metallization layer of the semiconductor package.

In yet another embodiment, disclosed is a packaged semiconductor circuit for use in processing digital and RF signals. The packaged semiconductor circuit includes a package structure having a first side that includes a metallization layer. The metallization layer has a first part at about a center of the first side and a second part that surrounds the center. The circuit further includes a semiconductor die that is attached to the package structure at about the first part of the metallization layer. The semiconductor die has an interconnection side including an array of bumps that are configured to make electrical connection to selected ones of a first plurality of metallization traces that are defined in the first part of the metallization layer of the package structure. The circuit also includes a spiral inductor trace that is formed from the metallization layer of the package structure and is defined in the first part of the metallization layer. And, selected ones of the array of bumps are electrically interconnected to a first end of the spiral inductor trace and to a second end of the spiral inductor trace, such that selected ones of the array of bumps electrically interconnect the spiral inductor trace of the package structure to the semiconductor die and to selected ones of the first plurality of metallization traces. Furthermore, the spiral inductor that is part of the package structure has a significantly improved quality factor "Q" and self-resonant frequency compared to a die fabricated inductor.

Advantageously, by fabricating the spiral inductors on the package, lower series resistances are obtained, and lower parasitic capacitances are achieved. Because the series resistance is lower and the parasitic capacitance is lower for on the package inductors, the quality factor "Q" for on the package inductors is significantly greater than that which is common for on-chip inductors. Further yet, the on the package inductors are also configured to have a substantially higher self-resonant frequency, relative to onchip inductors, thereby enabling high performance operation of the RF inductors at substantially higher frequencies. These and other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention is disclosed for a digital and RF circuit combination that is configured to be integrated in a chip and package arrangement. In general, the chip and package arrangement is designed to have RF inductors fabricated directly on the package in a location that is well suited to directly interface with the chip being packaged to achieve improved RF circuit performance, chip area reductions, and zero added development costs. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
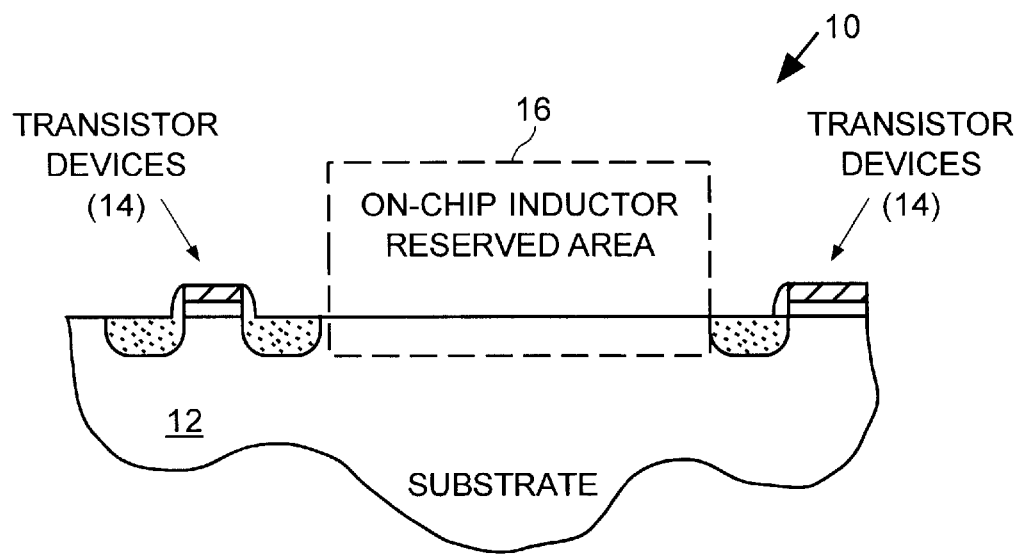
FIG. 1A shows a cross-sectional view of a substrate having an on-chip inductor reserved area, thereby preventing the use of the silicon substrate for other digital circuits.
Figure 1B:
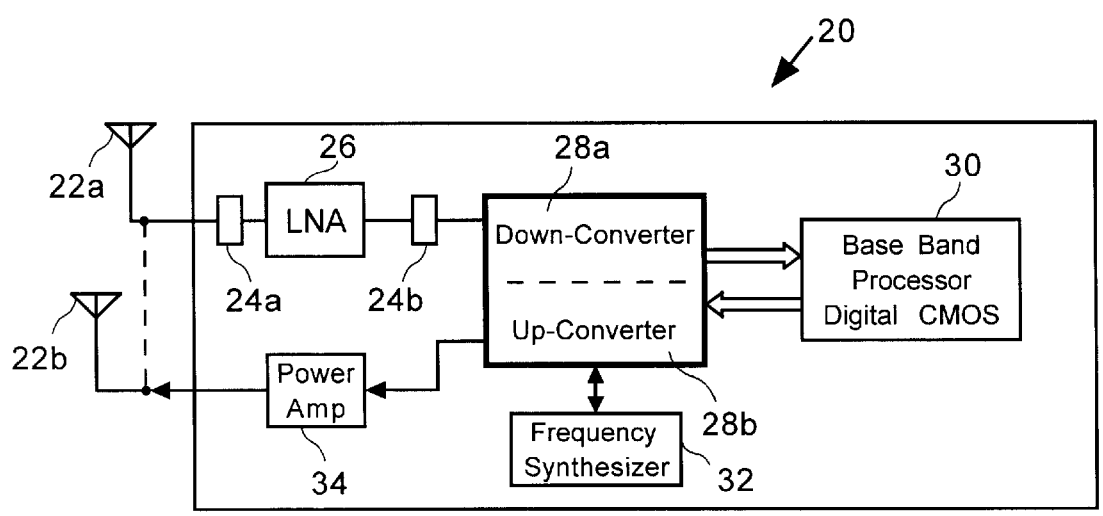
FIG. 1B illustrates a simplified example of RF and digital system circuitry for use in cellular phone applications.
Figure 1C:
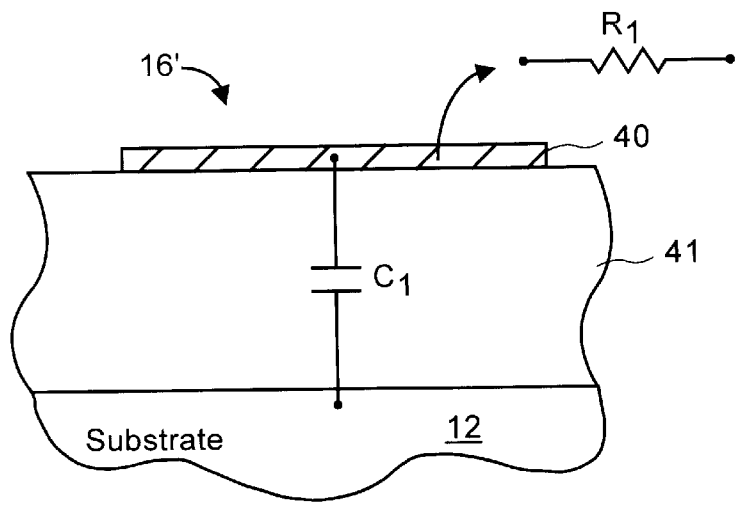
FIG. 1C illustrates a cross-sectional view of a substrate having a patterned metallization line over a dielectric layer.
Figure 1D:
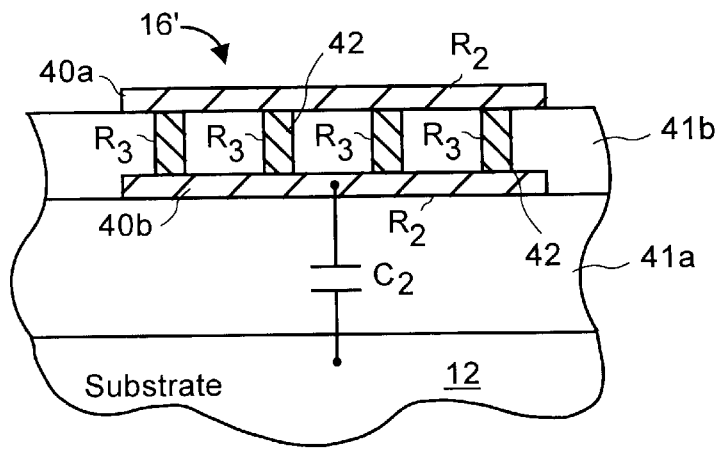
FIG. 1D illustrates the cross-sectional view of FIG. 1C having another metallization layer patterned thereon.
Figure 1E:
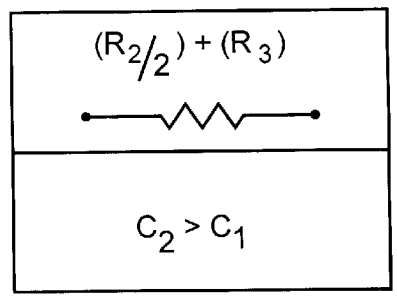
FIG. 1E illustrates the resistance and capacitive relationships between the capacitive patterns of FIGS. IC and ID.
Figure 1F:
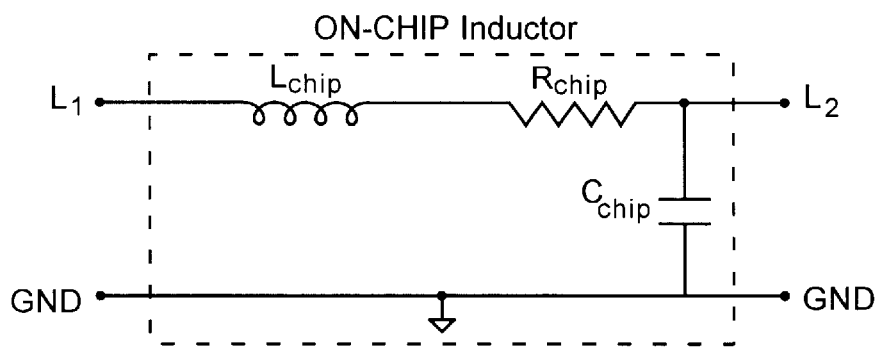
FIG. 1F illustrates a circuit representation of an on-chip inductor.
Figure 1G:
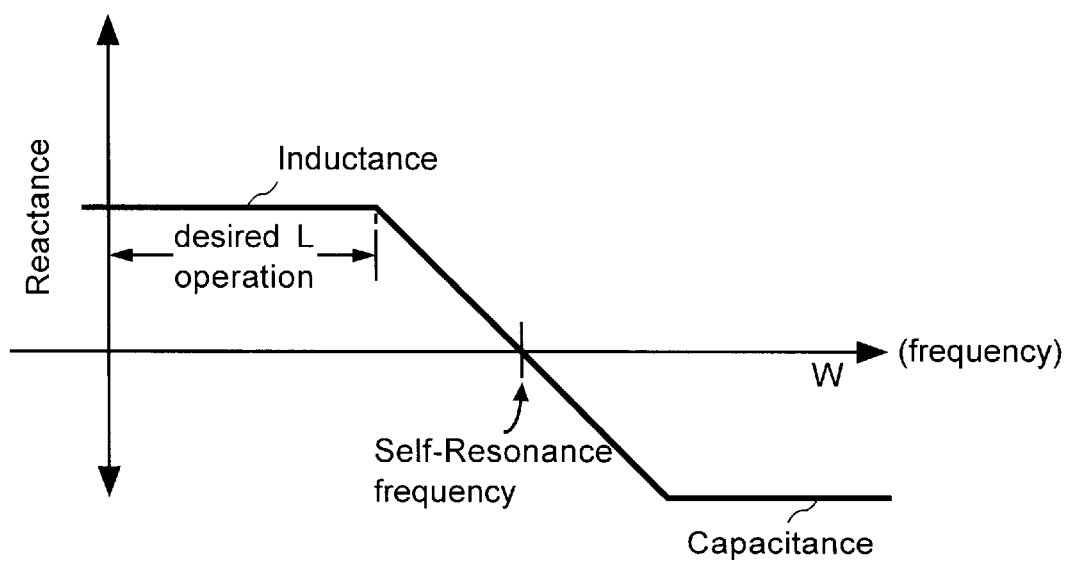
FIG. 1G illustrates a plot of reactance vs. frequency.
Figure 2A:
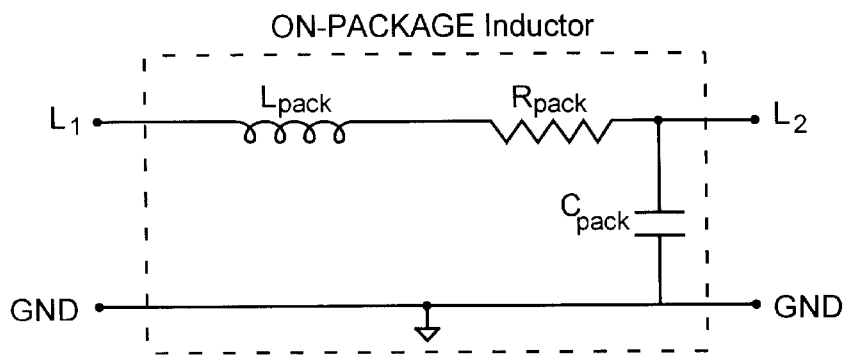
FIG. 2A illustrates a schematic representation of an inductor, which is fabricated on a semiconductor package and then interfaced with an IC chip, in accordance with one embodiment of the present invention.

FIG. 2A illustrates a schematic representation of an inductor, which is fabricated on a semiconductor package and then interfaced with an IC chip, in accordance with one embodiment of the present invention. As shown, the on-package inductor has terminals L1, L2 and ground (GND). The inductor will also have a parasitic series resistance Rpack and a parasitic capacitance Cpack. In the following quantification of quality factor and self-resonance frequency, it will be illustrated that substantial benefits are achieved by shifting inductors to the package, and then interfacing the inductive signals to the chip circuitry.

The benefits and advantages of the present invention are numerous, however, certain radio frequency (RF) applications, such as, cellular phone applications, pager applications, home RF network applications, radio communication applications and other consumer electronic applications, will benefit the most. Most significantly, the advantages of the present invention are achieved at a zero-added development cost, which makes the teachings of the present invention equally applicable to any electronic RF application where cost and performance are important considerations.

A. Quantification of Parasitic Package Resistance

For the following quantification, it will be assumed, as is common practice, that packaging technologies implement copper (Cu) to complete interconnecting metallization traces. Also, package traces are substantially thicker than the aluminum metal interconnections designed in IC chips, especially those used in leading submicron designs. For example, package traces generally have thicknesses in the order of 20 microns to 50 microns, while the thicknesses of chip interconnecting traces are in the order of 0.7 microns to 1.0 micron. However, what is most relevant in high frequency systems is "skin depth." Skin depth defines the actual thickness that contributes to a resistance calculation, and thus, skin depth thicknesses are typically well known for different materials at various frequencies. For example, the skin depth of Al at 1GHz is about ~4 microns, while the skin depth of Cu for the same frequency is about ~3 microns. Thus, for chip traces, the actual thickness of the trace will be used for the following quantification, however, the skin depth of the package traces will be used for the quantification (i.e., the thinner of skin depth or physical depth will be considered in the quantification below). To simplify discussion, whether skin depth thickness or the physical thickness is used, reference to thickness in the equations below will be referred to as $\chi$chip for the thickness of the chip traces and $\chi$pack for the thickness of the package traces. It is also generally known that the resistivity of copper (Cu) is about ⅔ that of aluminum (Al) (i.e., $\rho Cu = ⅔ \rho Al$).

$$R \text{ (resistance)} = \{\rho(\text{resistivity}) \cdot (\text{length}) \ L\} / \{(\text{width}) \ W \cdot t \ (\text{trace thickness})\} \quad (1)$$

$$R \text{ (high freq.)} = \{\rho(\text{resistivity}) \cdot (\text{length}) \ L\} / \{(\text{width}) \ W \cdot \chi(\text{skin depth})\} \quad (2)$$

A ratio between the Rpack divided by the Rchip is then taken. Because the length L and width W are the same, these terms will cancel out, leaving $\{\rho Cu/\rho Al\} \cdot \{\chi chip/\chi pack\}$. When the approximate numbers discussed above are plugged-in, $\rho Cu/\rho Al$ will be about 0.67. Further assuming that $\chi$chip is taken to be about 1.0 micron, and the skin depth of about 3.0 microns is taken for $\chi$pack, $\chi$chip/$\chi$pack will be about 0.34. Now, Rpack/Rchip using these exemplary numbers will produce a ratio of about ≈0.2. This quantification therefore proves that the parasitic series resistance of traces on a package will be substantially less than that of traces on a chip.

B. Quantification of Parasitic Package Capacitance

For capacitance, the well known equation of $C=\{\epsilon \cdot W \cdot L\}/d$ will be used for estimating the following quantifying comparison ratio between package and chip capacitances. Thus, when Cpack, the parasitic capacitance for the package, is divided by Cchip, the parasitic capacitance for the chip, a ratio of $\{\epsilon pack/\epsilon chip\} \cdot \{dchip/dpack\}$ results. In an exemplary case, the dielectric constant of the dielectric material used in a chip "$\epsilon chip$," will commonly be between 2.5 (i.e., low K dielectrics) and 4 (silicon dioxide). For the package, the dielectric constant of the dielectric material "$\epsilon pack$," will also commonly be between 2.5 (i.e., teflon based) and 4 (i.e., organic based). Thus, $\epsilon pack/\epsilon chip$ will, in this example be 1. The distance dchip, will commonly range from about 2 microns and about 5 microns, while dpack, will commonly range from about 40 microns and about 100 microns. Thus, dchip/dpack, in this example, will be about $\approx 0.05$, which is a conservative approximation.

C. Quantification of Inductance Quality Factor

The following will quantify an inductor's quality factor "Q" near the self-resonance frequency. Equation 3 below illustrates the variables that approximate the quality factor Q.

$$Q_{near\ self-resonance} \approx \{\sqrt{L/C_{shunt}}\}/R_{series} \quad (3)$$

Now, a ratio of the quality factor of the package relative to the chip (i.e., Qpack/Qchip) is calculated. Equation 4 illustrates the ratio after simplification of terms.

$$Qpack/Qchip=\{Rchip/Rpack\} \cdot \{\sqrt{(Cchip/Cpack)}\} \quad (4)$$

As illustrated above in sections A and B, a conservative value was obtained for both Rchip/Rpack and Cchip/Cpack, respectively. Equation 5 below illustrates the calculation of equation 4 with the exemplary values.

$$Qpack/Qchip=(5) \cdot \sqrt{(20)}=22.4 \quad (5)$$

Although the above calculations were conservative, even more conservative calculations would yield a ratio that is no lower than about 10, thus making a plausible ratio range of between 10 and 25. As mentioned above, IC chips typically have poor quality factors Q ranging between 4 and 8. If the conservative ratio of 10 is used, the quality factor of inductors made on the package can range between 40 and 80. However, if the derived ratio of 22.4 is used, the quality factor Q for inductors made on the package may well be able to range between about 90 and 180.

D. Quantification of Self-Resonant Frequency

As mentioned above, an the performance of an inductor is not only measured by its quality factor Q, but also the self-resonant frequency. Thus, it is desirable to have an inductor that has a large self-resonant frequency because that will provide a wider window of useful frequency operation. In equation 6, the self-resonant frequency (($\omega$) is defined.

$$\omega_{self-resonance}=1/\sqrt{(L \cdot C_{shunt})} \quad (6)$$

When a ratio of the self-resonant frequency of the package relative to the chip is taken (i.e., $\omega pack/\omega chip$), the equation 7 results.

$$\omega pack/\omega chip=\sqrt{(Cchip/Cpack)} \quad (7)$$

As calculated above, Cchip/Cpack is about 20, and the square root of 20 is about 4.5. Accordingly, if wchip ranges between 2–4 GHz, wpack will range between 9 and 18 GHz. This now proves that the self-resonant frequency is higher for inductors fabricated on the package.

Figure 2B:
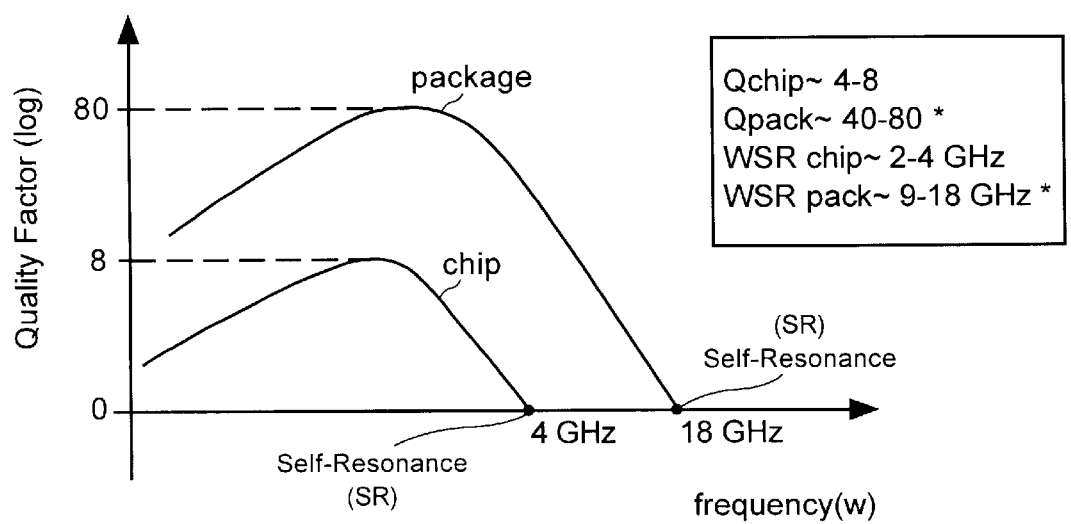
FIG. 2B is a graph illustrating a comparative plot of logarithmic quality factor vs. frequency for on-chip and on-package inductors.

Now that the quantification of sections A–D are complete, reference is drawn to FIG. 2B, which provides a plot of logarithmic quality factor vs. frequency. Using the ranges derived above, it is evident that a substantially larger quality factor Q can be achieved when an inductor is fabricated on the package. Also evident is that the self-resonant frequency is larger for the package, which provides the inductor with a wider range of useful operation. Accordingly, it is now evident that fabrication of inductors on a package will provide substantial performance improvements over the fabrication in the chip environment.

In the following illustrative applications, it will be important to realize that several advantages are achieved in each chip/package combination technology. Firstly, the quality factor Q and the self-resonant frequency $\omega_{self-resonance}$ of the inductors will be dramatically improved because they will not be fabricated on the chip. Secondly, a substantial amount of chip space is saved because, as discussed above, on-chip inductors take up a lot of area, which necessarily drives up the cost of the chip. Third, in each chip/package technology implementation, the improvement in inductor performance is achieved at a zero-added development cost. The illustrative applications will therefore utilize: (1) a tape based package technology of FIGS. 3A3B (most cost effective: one layer), (2) a plastic core based package technology of FIGS. 4A–4B (most cost effective: two layer), and (3) a laminate based package technology of FIGS. 5A–5C (most cost effective: 3 layer). Although any number of more expensive level package technologies may be used (i.e., more layers), the examples provided herein will concentrate on illustrating the most cost effective package embodiment of each of the package technologies. Of course, if the inductor performance benefits can be achieved in the most cost effective packages of the package technologies, the same can also be achieved in the more expensive package arrangements of the package technologies.

E. Exemplary Package/Chip Implementations

Figure 3A:
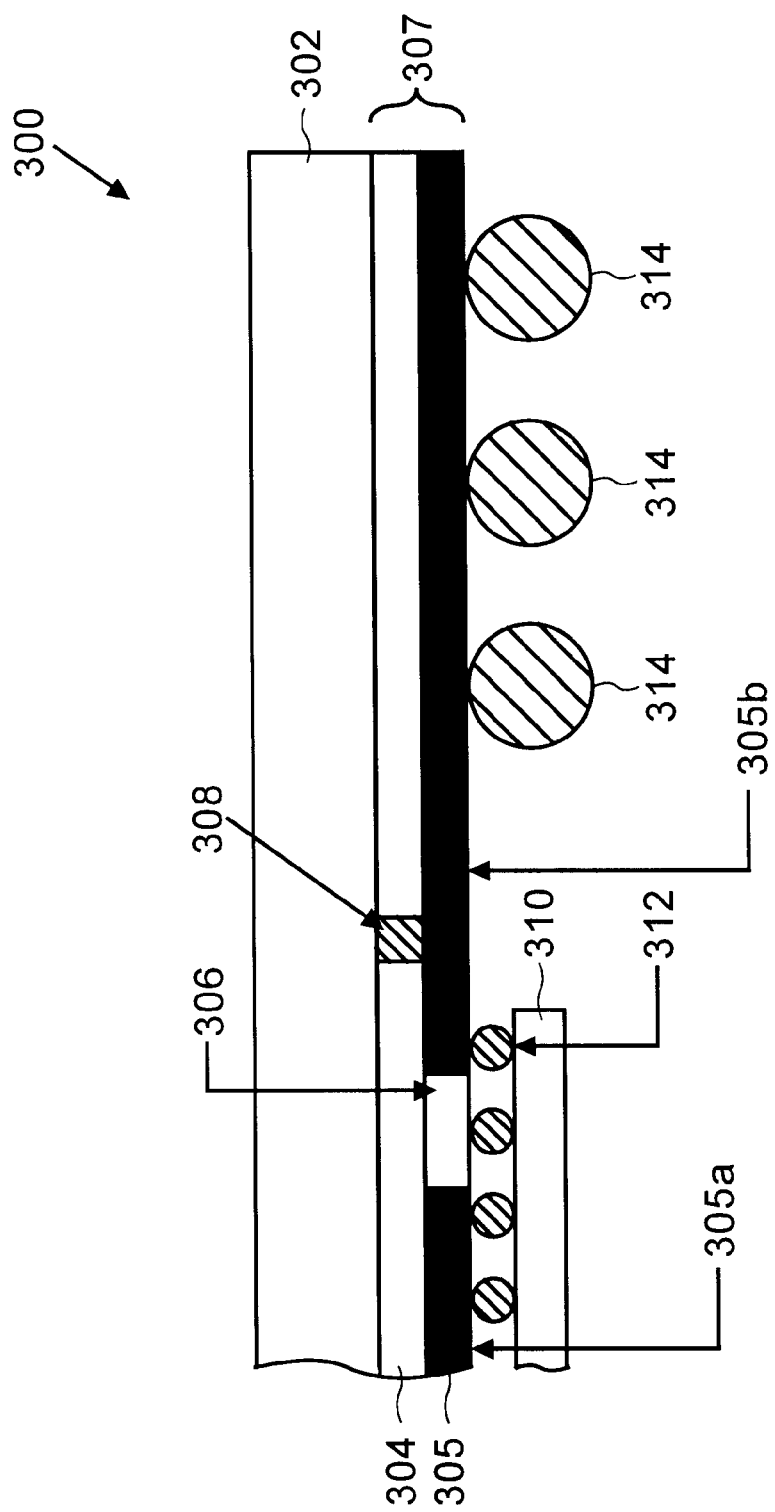
FIG. 3A illustrates an exemplary tape-based flip-chip package implementing a spiral inductor, in accordance with one embodiment of the present invention.

FIG. 3A illustrates an exemplary tape-based flip-chip package 300 implementing a spiral inductor 305a, in accordance with one embodiment of the present invention. In this embodiment, any inductors required to carry out specific RF signal processing will not be integrated into the silicon die 312, but will be integrated into the package itself, preferably under the attached silicon die 310.

As an overview, the tape-based flip-chip package 300 includes a heat spreader 302, and a tape substrate 307. The tape substrate 307 includes an insulation layer 304 which adheres to the heat spreader 302. The tape-based substrate 307 also includes a metal layer 305. As shown, the metal layer 305 is divided into two parts. The first part is that which lies under the die 310, and the second part is that which lies outside of the die 310. As mentioned above, the spiral inductor 305a will be designed from the metallization layer that lies under the die 310, which is at about the center of the package. An example of the spiral inductor 305a will be illustrated below in FIG. 3B. The metallization layer 305b which lies outside of the die region also includes patterning for routing signals, ground, and power. As is well known, the tape substrate 307 is well configured to receive a plurality of solder balls 314, such as BGA solder balls.

The silicon die 310 is attached and electrically interconnected to the tape substrate 307 using a bump array of solder balls 312. The silicon die 310 is provided with interconnections to power (Vdd) and ground (Vss) traces in region 306 which are communicated to the die 310. The tape-based flip-chip package 300 also includes a plurality of ground vias 308 which interconnect selected routed lines of the metal layer 305 to the heat spreader 302, which may function as a ground plane.

Figure 3B:
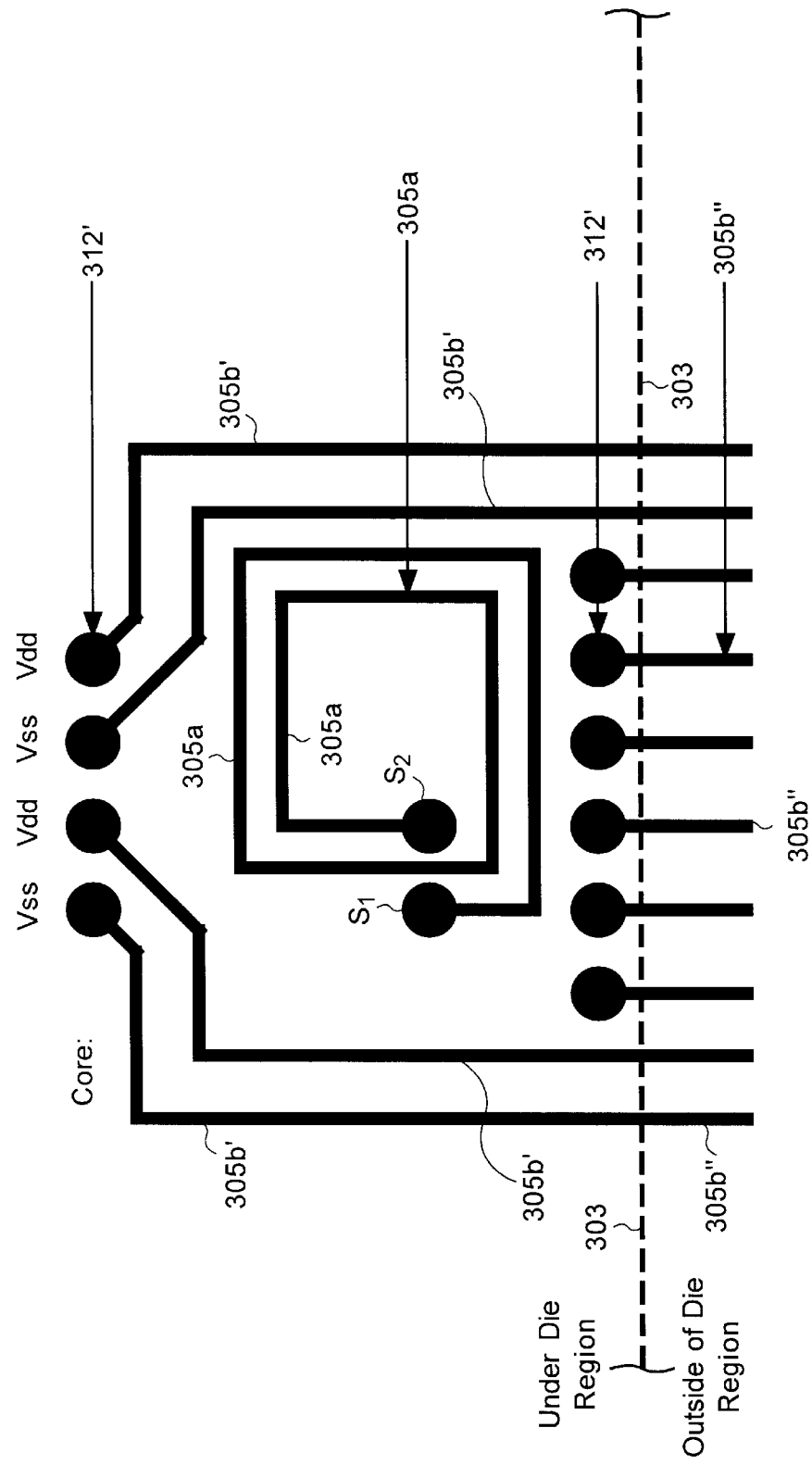
FIG. 3B illustrates an example top view of a single spiral inductor 305a having a signal Si at a first end and a signal S2 at a second end, in accordance with one embodiment of the present invention.

FIG. 3B illustrates an example top view of a single spiral inductor 305a having a signal connection $S_1$ at a first end and a signal connection $S_2$ at a second end. The spiral inductor 305a is shown here as one exemplary spiral inductor that is configured to lie underneath the silicon die 310. Of course, many more spiral inductors 305a may be patterned throughout the under-region of the silicon die 310, depending upon the number of inductors needed for a particular RF/CMOS circuit application. The metal layer 305 is also provided with several routing lines to provide the chip core with power (Vdd) and ground (Vss) via bump receiving patterns 312'.

Generally, several under-die region routing 305b' is provided to assists in communicating power and ground to various locations under the die 310. In this example, a separation line 303 is provided to illustrate that some of the routing 305b is located under the die region 305b', while other routing 305b is located outside of the die region 305b". The die 310 may also make electrical interconnections using selected bump receiving patterns 312', which may then be routed to other parts of the tape-based package for interfacing to the BGA solder balls 314.

Figure 4A:
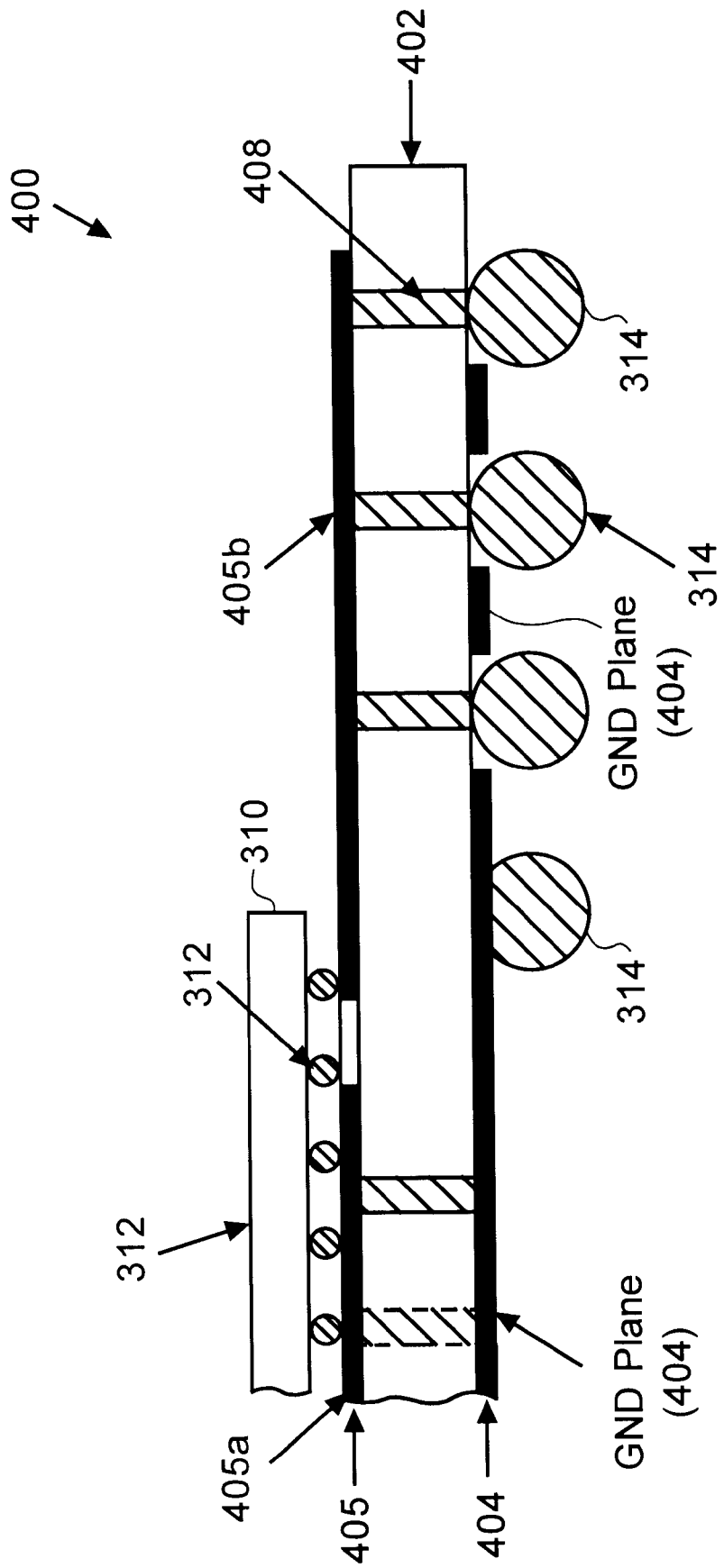
FIG. 4A illustrates an exemplary plastic core flip chip package in accordance with one embodiment of the present invention.

FIG. 4A illustrates an exemplary plastic core package 400 in accordance with one embodiment of the present invention. The plastic core package 400 includes a center plastic core 402 that has a ground plane metallization 404 on one side, and a metallization layer 405 on the other side. The metallization layer 405 is divided into two parts. The first part is that which embodies at least one spiral inductor 405a that lies under the silicon die 310. The other part is the metallization layer 405b that lies outside and surrounds the die region (i.e., not underneath the silicon die 310).

The silicon die 310 is attached to the package 400 implementing a bump array 312. The bump array 312 therefore communicates signals between the silicon die 310 and the package 400. As is well known, the plastic core 402 generally has a plurality of conductive vias 408 which assist in communicating signals routed on the metallization layer 405 down to selected solder balls 314 of the solder ball array. Additionally, the conductive vias 408 are also used to provide power and ground connection to selected ones of the bump array balls 312, which communicate power and ground connection to the silicon die 310.

Figure 4B:
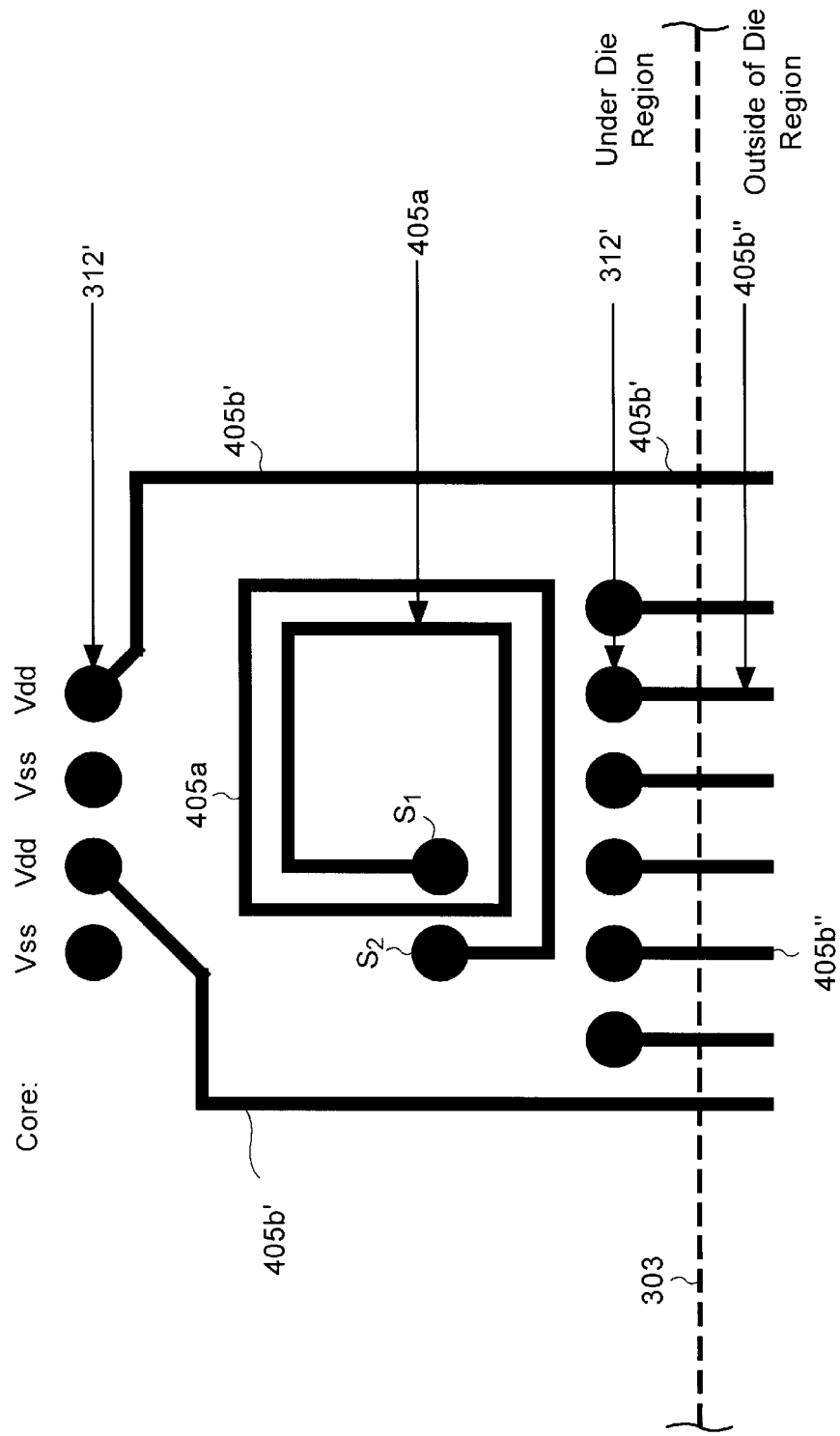
FIG. 4B illustrates an exemplary partial plan view of the plastic core package of FIG. 4A, in accordance with one embodiment of the present invention.

FIG. 4B illustrates an exemplary partial plan view of the plastic core package of FIG. 4A, in accordance with one embodiment of the present invention. In this example, only one spiral inductor 405a is illustrated, however, it should be understood that a plurality of spiral inductors may be patterned under the silicon die 310 depending upon the particular RF/digital circuit application. The spiral inductor 405a will have a signal connection $S_1$ and a signal connection $S_2$ which may denote the in and out terminals of the spiral inductor 405a. Also shown is a plurality of traces 405b, some which lie under the die region, such as 405b', and those which lie outside of the die region, such as 405b".

Also patterned on the metallization layer 405 are a plurality of bump receiving patterns 312', which are designed to make interconnection with the bump solder balls 312 shown in FIG. 4A. In this example, some of the bump receiving patterns 312' are used for interfacing ground and power to selected regions of the silicon die 310. Other ones of the bump receiving patterns 312' are merely provided to provide interconnecting traces to the outside of the die region and then down to selected ones of the solder balls 314.

Figure 5A:
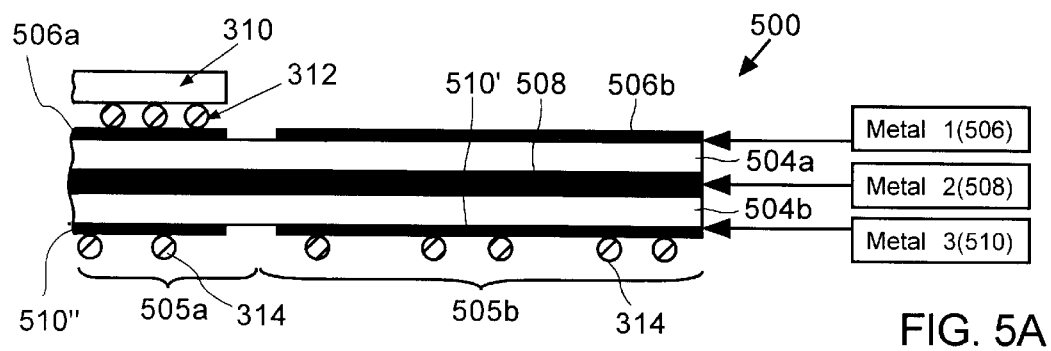
FIG. 5A illustrates an exemplary partial view of a laminate flip chip package implementing a copper core, in accordance with one embodiment of the present invention.

FIG. 5A illustrates an exemplary partial view of a laminate package implementing a copper core, in accordance with one embodiment of the present invention. In this example, the laminate package is a three-layer metal package. The layers include a metal 1 layer 506, a metal 2 layer 508, and a metal 3 layer 510. The three metal layers are insulated from one another using dielectric insulators 504a and 504b. The metal 1 layer 506 is shown divided into two parts. The first part is that which lies under the silicon die 310, and defines the location where at least one spiral inductor 506a is formed. The second part is that which lies outside of the die 310 and is defined by layer 506b.

The laminate package 500 is thus divided into two parts, one lying under the silicon die 310 which is identified as region 505a, and that which lies outside of the silicon die 310 which is identified as region 505b. Metal 3 layer 510 is further divided into two parts. The first part is region 510' which is used for routing input/output (I/O) power (Vdd). Metal region 510" is used for routing core power Vdd which provides the power to the silicon die 310 using a suitable number of conductive vias (not shown). Metal 2 layer 508 is used as a conductive ground plane.

Figure 5B:
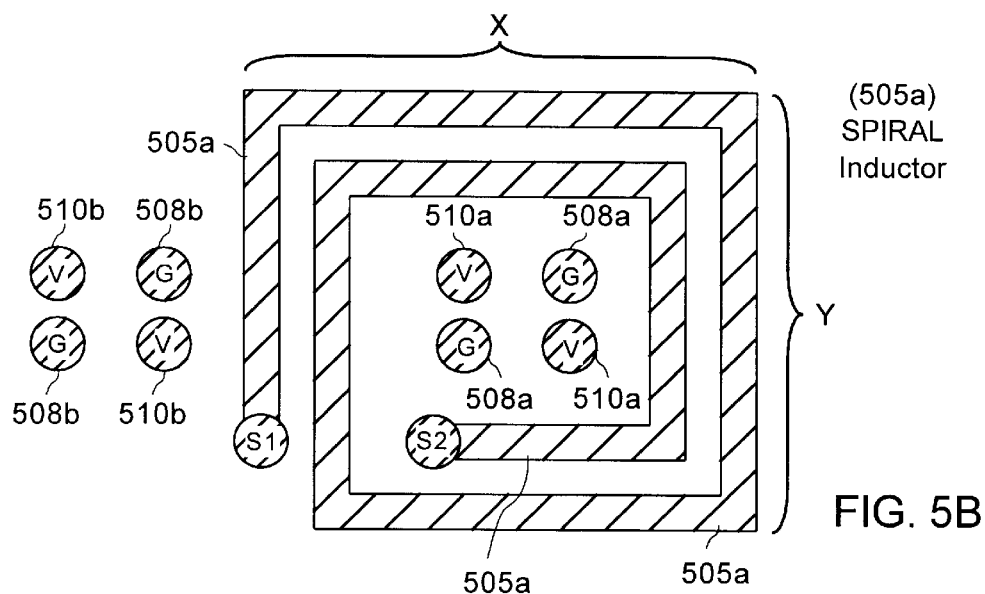
FIG. 5B illustrates a top view of a spiral inductor, in accordance with one embodiment of the present invention.

FIG. 5B illustrates a top view of a spiral inductor 505a, in accordance with one embodiment of the present invention. In this example, only one spiral inductor 505a is shown, however, it should be understood that many more spiral inductors 505a may be located under the silicon die 310 depending upon the application being designed. In this example, a spiral inductor 505a has dimensions pictorially illustrated as X and Y, and these dimensions typically range between about 300 microns and about 600 microns for X, and between about 300 microns and about 600 microns for Y. In one specific example, the X dimension may be about 400 microns and the Y dimension may be about 400 microns.

Also shown are a plurality of conductive vias for routing power (V) and ground (G). In this example, there may be a plurality of power and ground vias 510a and 508a defined within the spiral inductor 505a. In addition, there may be other power and ground vias 510b and 508b which are defined outside of the spiral inductor 505a. As mentioned above, the spiral inductor 505a is only one exemplary spiral inductor, and many more may be patterned using the metal 1 layer 506 of the laminate package as illustrated in FIG. 5C.

Figure 5C:
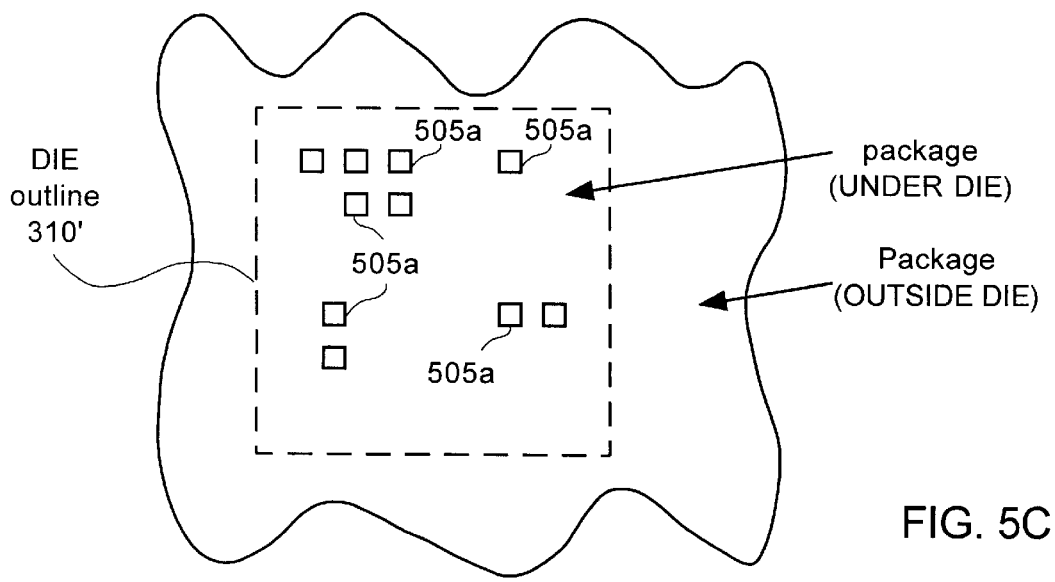
FIG. 5C illustrates a region of the package that lies under the die 310, having a plurality of inductors in accordance with one embodiment of the present invention.

FIG. 5C illustrates a region of the package that lies under the die 310, and is identified by a die outline 310'. Also shown is a package region that lies outside of the die 310. In this example, a plurality of spiral inductors 505a are defined in various locations under the die 310. The number of spiral inductors will vary from application to application, however, the benefits of implementing the spiral inductors directly on a package provides significant inductor performance, in terms of higher quality factor levels and higher self-resonant frequencies.

Figure 6:
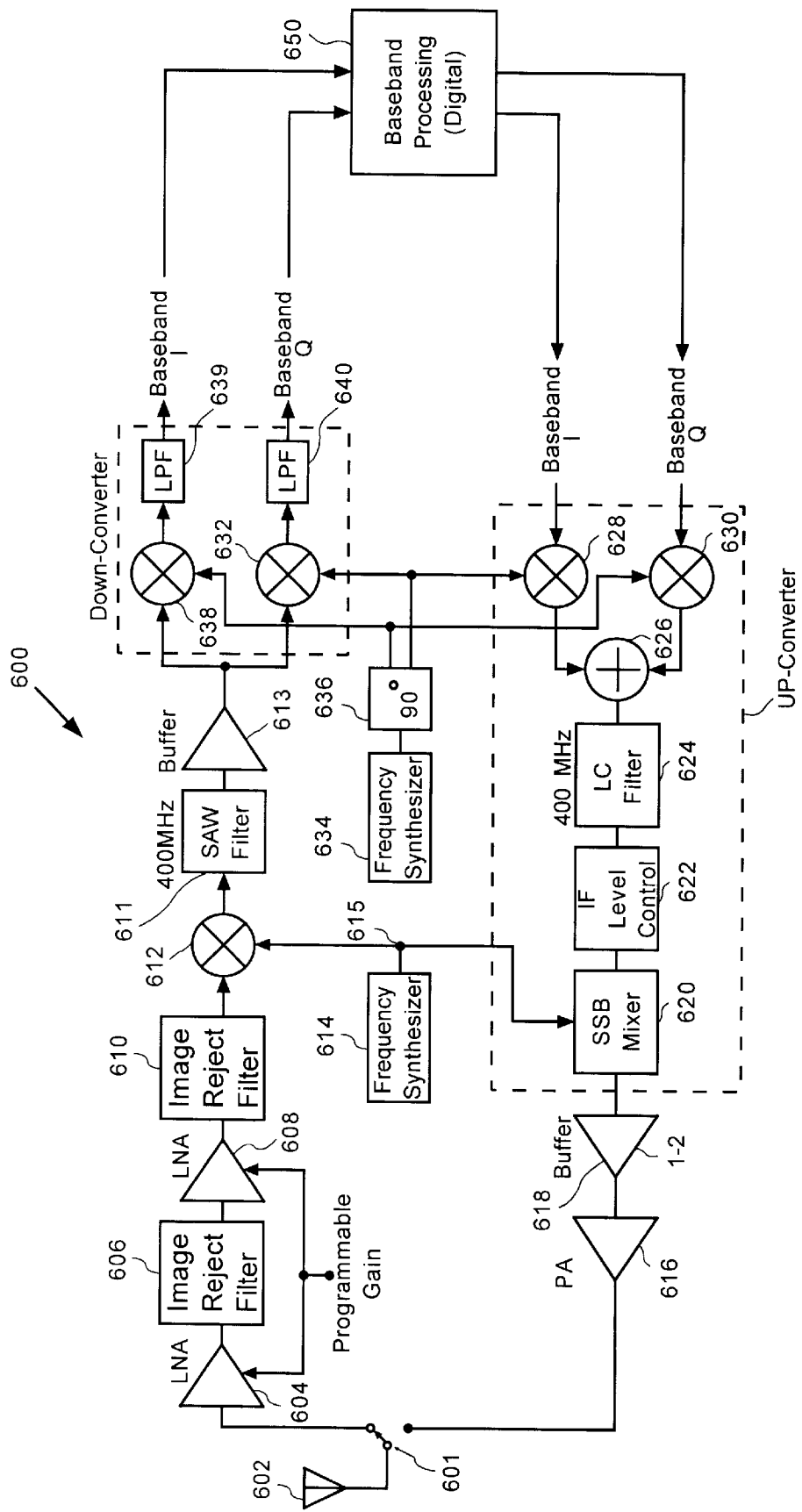
FIG. 6 illustrates an exemplary cellular phone circuit application which requires the use of a plurality of spiral inductors for implementing RF signal processing, in accordance with one embodiment of the present invention.

FIG. 6 illustrates an exemplary cellular phone circuit application which requires the use of a plurality of RF inductors for implementing RF signal processing, in accordance with one embodiment of the present invention. In general, each of the inductors required in the cellular phone application will be formed on the package itself and then interconnected to the silicon die via the solder bumps as discussed above. The cellular phone application 600 includes an antenna 602. The antenna 602 may be used as both the transmitting and the receiving antenna depending upon the switch 601 setting.

During a receiving operation, the signals are received via the antenna 602, and communicated through the switch 601 to a low noise amplifier (LNA) 604. The low noise amplifier 604 typically implements between 2 and 4 inductors. The low noise amplifier is coupled to an image reject filter 606 and then couples to another low noise amplifier 608. The low noise amplifier 608 will also implement between 2 and 4 inductors. From the low noise amplifier 608, the signal is passed to an image reject filter 610 which then communicates to a mixer 612.

The mixer 612 typically implements between 0 and 2 inductors depending upon the design parameters. Also provided is a frequency synthesizer 614 which implements about 4 inductors. The frequency synthesizer is coupled to a node 615 which couples back to the mixer 612. From the mixer 612, a connection is made to a SAW filter 611 which then couples to a buffer 613. The buffer 613 may have between 1 and 2 inductors. From the buffer 613, the signal is communicated to a pair of mixers 632 and 638. As mentioned before, each mixer may include between 0 and 2 inductors. From mixer 638, the signal is passed to a low pass filter 639 for communicating a baseband I to a baseband processing module 650 (i.e., CMOS digital circuitry).

The mixer 632 will also communicate through the low pass filter 640 and communicate a baseband Q, when proper, to the baseband processing module 650. Therefore, mixers 632, 638, low pass filter 639 and 640 form what is referred to as a down-converter. The down-converter generally converts the RF signals down to a digital signal before being communicated to the baseband processing module 650. Also shown is a frequency synthesizer 634 which may also implement about 4 inductors, and a 90 degrees phase shifter 636.

Upon transmission, the baseband processing module 650 will communicate baseband I and baseband Q, when proper, to an up-converter which is configured to convert the digital signals received from the baseband processing module 650 into appropriate RF signals. The up-converter will include mixers 628 and 630, each implementing between 0 and 2 inductors. The mixers are then communicated to an adder 626 which couples to an LC filter 624, and then communicates to an IF level control 622. The IF level control 22 may include between 1 and 2 inductors. The signal is then passed to an SSB mixer 620 and then out to a buffer 618. The buffer may also include between 1 and 2 inductors. Next, the signal may be passed to a power amplifier 616 before being transmitted out to the antenna 602 when the switch 601 is properly set.

As can be appreciated from this exemplary cellular phone application, there is a substantial number of inductors which are needed to implement the RF processing. Accordingly, by shifting any inductors to the package in a location that lies under the die, a much higher inductor performance can be achieved, while saving a substantial amount of die space.

In summary, because there is a growing need to integrate digital CMOS circuitry with radio frequency (RF) circuitry into small, high performing, and cost effective arrangements, the integration of RF circuitry inductors into the package and interfacing the inductors directly to the digital CMOS circuitry provides a very significant advance over the prior art. As mentioned previously, inductors that are fabricated on-chip take up a lot of chip area, and therefore, substantial area savings are realized by making the inductors on the package. Furthermore, as quantified above, on-chip inductors generally have very poor performance characteristics, in terms of quality factor "Q" and self-resonant frequency, relative to on the package inductors. Another significant advance is that fabricating the inductors on the package is achieved at an essentially zero added development cost. This is because, with existing technology, RF inductors can, in view of the teachings herein, be patterned in the metallization layers of the package in regions that are currently underutilized, without increasing the cost of the package. Thus, high performance RF and digital "system-on-a-chip" applications can now be easily made without significantly increasing cost, while at the same time increasing RF inductor performance.

Accordingly, the inventive integration of RF inductors into the package and then interfacing the RF inductors to the chip being packaged presents a much needed advance in the communications industry. As mentioned above, the embodiments of the present invention have a much needed application in the cellular telephone industry, pager communications industry, radio frequency (RF) network industry, radio communication industry, and other consumer electronic industries.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A digital and radio frequency (RF) circuit, comprising:
   a package structure having a first side that includes a metallization layer, the metallization layer is divided into a first part and a second part;
   a semiconductor die having integrated circuitry being attached to the package structure such that the semiconductor die overlies a portion of the first part of the metallization layer and a portion of the second part, the semiconductor die having an interconnection side including an array of bumps that are configured to make electrical connection to selected ones of a first plurality of metallization traces that are defined in the first part of the metallization layer of the package structure; and
   a spiral inductor trace defined from the metallization layer of the package structure, the spiral inductor trace defined from the first part of the metallization layer, and selected ones of the array of bumps electrically interconnect the spiral inductor trace to the semiconductor die.

2. A digital and radio frequency (RF) circuit as recited in claim 1, further comprising:
   an input signal terminal defined at a first end of the spiral inductor; and
   an output signal terminal defined at a second end of the spiral inductor.

3. A digital and radio frequency (RF) circuit as recited in claim 2, further comprising:
   a plurality of interconnecting traces defined from the metallization layer, such that selected ones of the plurality of interconnecting traces provide a power source, selected ones provide a ground source, and selected ones provide signals to and from the semiconductor die through selected ones of the array of bumps.

4. A digital and radio frequency (RF) circuit as recited in claim 1, further comprising:

an array of solder balls being coupled to the second part of the metallization layer of the first side of the package structure.

5. A digital and radio frequency (RF) circuit as recited in claim 4, further comprising:

a second plurality of metallization traces defined on the second part of the metallization layer and configured to electrically connect to selected ones of the array of solder balls.

6. A digital and radio frequency (RF) circuit as recited in claim 5, wherein selected ones of the first plurality of metallization traces integrally interconnect to selected ones of the second plurality of metallization traces, thereby providing electrical connections between the array of solder balls coupled to the second part and the array of bumps coupled to the semiconductor die that lies over at least a portion of the first part and a portion of the second part.

7. A digital and radio frequency (RF) circuit as recited in claim 1, further comprising:

metallization layer defined on a second side of the package structure, the metallization layer having a plurality of conductive traces; and an array of solder balls coupled to selected ones of the plurality of conductive traces of the metallization layer of the second side of the package structure.

8. A digital and radio frequency (RF) circuit as recited in claim 7, further comprising:

a plurality of conductive vias for interconnecting the metallization layer of the first side of the package structure to the second side of the package structure, and selected ones of the array of solder balls configured to make electrical interconnection to the array of bumps of the semiconductor die.

9. A digital and radio frequency (RF) circuit as recited in claim 2, wherein the spiral inductor trace is implemented in RF signal processing.

10. A digital and radio frequency (RF) circuit as recited in claim 1, wherein the package structure is one of a tape-based flip-chip package, a plastic core package, and a laminate package.

11. A digital and radio frequency (RF) circuit as recited in claim 1, further comprising:

integrating the digital and RF circuit into an electronic communication device.

12. A digital and radio frequency (RF) circuit as recited in claim 11, wherein the electronic communication device is a cellular telephone, a pager, a home RF network, and a radio.

13. A packaged semiconductor circuit, comprising:

a package structure having a first side that includes a metallization layer, the metallization layer has a first part at about a center of the first side and a second part that surrounds the center;

a semiconductor die having integrated circuitry is attached to the package structure at about the first part of the metallization layer such that the semiconductor die overlies a portion of the first part of the metallization layer and at least a portion of the second part of the metallization layer, the semiconductor die having an interconnection side including an array of bumps that are configured to make electrical connection to selected ones of a first plurality of metallization traces that are defined in the first part of the metallization layer of the package structure; and a spiral inductor trace defined from the metallization layer of the package structure, and defined in the first part of the metallization layer, and selected ones of the array of bumps being electrically interconnected to a first end of the spiral inductor trace and to a second end of the spiral inductor trace, such that selected ones of the array of bumps electrically interconnect the spiral inductor trace of the package structure to the semiconductor die and to selected ones of the first plurality of metallization traces.

14. A packaged semiconductor circuit as recited in claim 13, wherein a plurality of the spiral inductors are defined in the first part of the metallization layer and under the semiconductor die, such that the semiconductor die is electrically interconnected to the plurality of the spiral inductors.

15. A packaged semiconductor circuit as recited in claim 14, wherein the plurality of the spiral inductors are implemented for RF signal processing.

16. A packaged semiconductor circuit as recited in claim 15, wherein the semiconductor chip is a CMOS chip.

17. A packaged semiconductor circuit as recited in claim 13, wherein the spiral inductor has an improved quality factor "Q" and an increased self-resonant frequency relative to chip fabricated inductors.

18. A packaged semiconductor circuit as recited in claim 17, wherein the improved quality factor "Q" can range up to about 180.

19. A packaged semiconductor circuit as recited in claim 18, wherein the improved quality factor "Q" can range up to about 80.

20. A packaged semiconductor circuit as recited in claim 17, wherein the self-resonant frequency ranges up to about 18 GHz.

* * * * *